(12) United States Patent
Chen et al.

(10) Patent No.: US 7,939,834 B2
(45) Date of Patent: May 10, 2011

(54) LIGHT- EMITTING DEVICE

(75) Inventors: Shi-Ming Chen, Tainan County (TW); Chang-Hsin Chu, Tainan County (TW)

(73) Assignee: Chi Mei Lighting Technology Corporation, Tainan County (TW)

( * ) Notice: Subject to any disclaimer, the term of this patent is extended or adjusted under 35 U.S.C. 154(b) by 316 days.

(21) Appl. No.: 12/126,482

(22) Filed: May 23, 2008

(65) Prior Publication Data
US 2009/0159899 A1 Jun. 25, 2009

(30) Foreign Application Priority Data
Dec. 19, 2007 (TW) .............................. 96148659 A

(51) Int. Cl.
*H01L 27/15* (2006.01)
(52) U.S. Cl. ............ 257/79; 257/86; 257/276; 257/675; 257/E33.075

(58) Field of Classification Search ..................... 257/86, 257/79, 276, 675, E33.075
See application file for complete search history.

(56) References Cited

U.S. PATENT DOCUMENTS

| | | | |
|---|---|---|---|
| 5,981,085 A * | 11/1999 | Ninomiya et al. | 428/614 |
| 2002/0017653 A1* | 2/2002 | Chuang | 257/103 |
| 2007/0069222 A1* | 3/2007 | Ko et al. | 257/86 |

* cited by examiner

*Primary Examiner* — Jerome Jackson, Jr.
*Assistant Examiner* — Dale Page
(74) *Attorney, Agent, or Firm* — Morris Manning Martin LLP; Tim Tingkang Xia, Esq.

(57) ABSTRACT

A light-emitting device includes a substrate having an epitaxial-forming surface and a back surface opposite to the epitaxial-forming surface, the substrate being formed with a recess indented from the back surface, the back surface having a recessed portion that defines the recess, and a planar portion extending outwardly from the recessed portion; an epitaxy layer; a continuous heat-dissipating layer formed on the planar portion and the recessed portion of the back surface of the substrate; and first and second electrodes coupled electrically to the epitaxy layer.

6 Claims, 4 Drawing Sheets

LIGHT-EMITTING DEVICE

CROSS-REFERENCE TO RELATED APPLICATION

This application claims priority of Taiwanese application no. 096148659, filed on Dec. 19, 2007.

BACKGROUND OF THE INVENTION

1. Field of the Invention

This invention relates to a light-emitting device, more particularly to a light-emitting device including a substrate formed with a recess, and a continuous heat-dissipating layer formed on the substrate.

2. Description of the Related Art

FIG. 1 illustrates a conventional light-emitting diode that includes a sapphire substrate 11 having an epitaxial-forming surface 111 and a back surface 112 opposite to the epitaxial-forming surface 111, an epitaxy layer 12 formed on the epitaxial-forming surface 111, and a pair of electrodes 131, 132 coupled to the epitaxy layer 12.

When electricity is applied on the epitaxy layer 12 of the light-emitting diode, light resulting from electron-hole pairs in the epitaxy layer 12 will be generated. However, nearly 70% of light generated in the diode is converted into heat, thereby causing a junction temperature of the light-emitting diode to increase, which results in a decrease in radiative recombination efficiency of the light-emitting diode. In general, the sapphire substrate 11 is attached to an aluminum board 150 through a silver paste 140. Since the aluminum board 150 has a relatively large area, heat generated in the diode can be dissipated quickly therefrom, thereby permitting lowering of the junction temperature of the light-emitting device. Since the heat generated in the diode is dissipated through the sapphire substrate 11 to the aluminum board 150, and since the sapphire substrate 11 has a thick layer thickness and a relatively low thermal conductive coefficient, heat dissipation of the diode is still insufficient.

FIG. 2 illustrates a diode modified from the diode of FIG. 1. In this diode, the sapphire substrate 11 is removed through wafer bonding techniques, and the epitaxy layer 12 is directly attached to a silicon substrate 120 having a relatively high thermal conductive coefficient, which can improve heat dissipation of the light-emitting device. However, crystal defects propagating in the epitaxial layer 12 and resulting from a high stress applied on the light-emitting device can occur during removal of the sapphire substrate 11.

SUMMARY OF THE INVENTION

Therefore, an object of the present invention is to provide a light-emitting device that can overcome the aforesaid drawbacks associated with the prior art.

According to the present invention, a light-emitting device comprises: a substrate having an epitaxial-forming surface and a back surface opposite to the epitaxial-forming surface, the substrate being formed with a recess indented from the back surface, the back surface having a recessed portion that defines the recess, and a planar portion extending outwardly from the recessed portion; an epitaxy layer formed on the epitaxial-forming surface of the substrate; a continuous heat-dissipating layer formed on the planar portion and the recessed portion of the back surface of the substrate; and first and second electrodes coupled electrically to the epitaxy layer.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
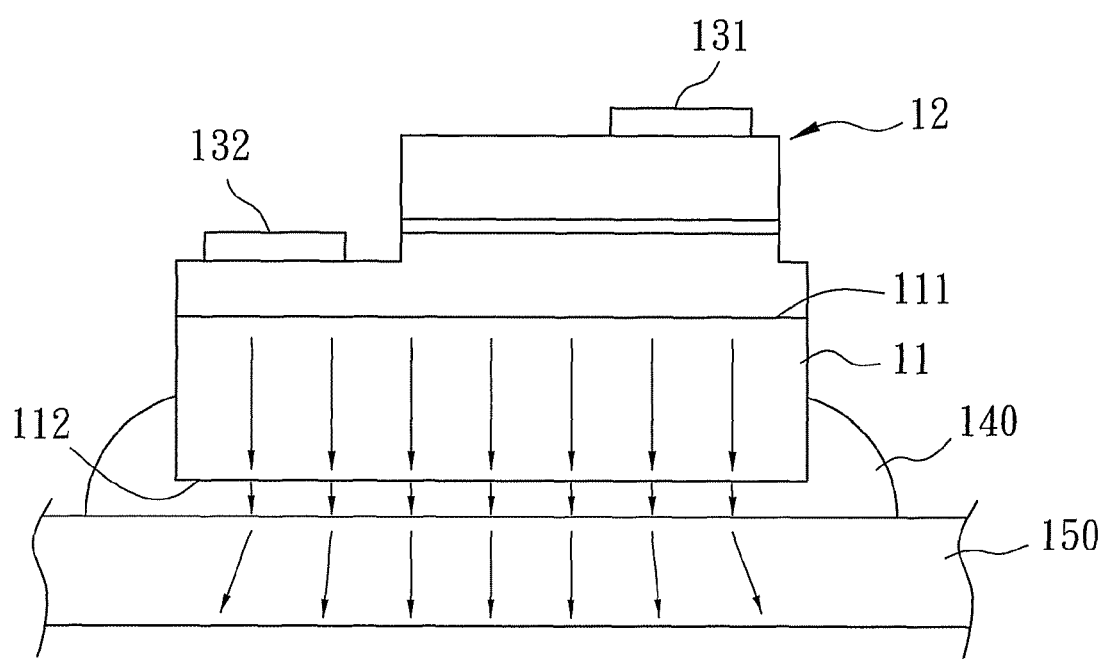
FIG. 1 is a fragmentary schematic view of a conventional light-emitting diode.
Figure 2:
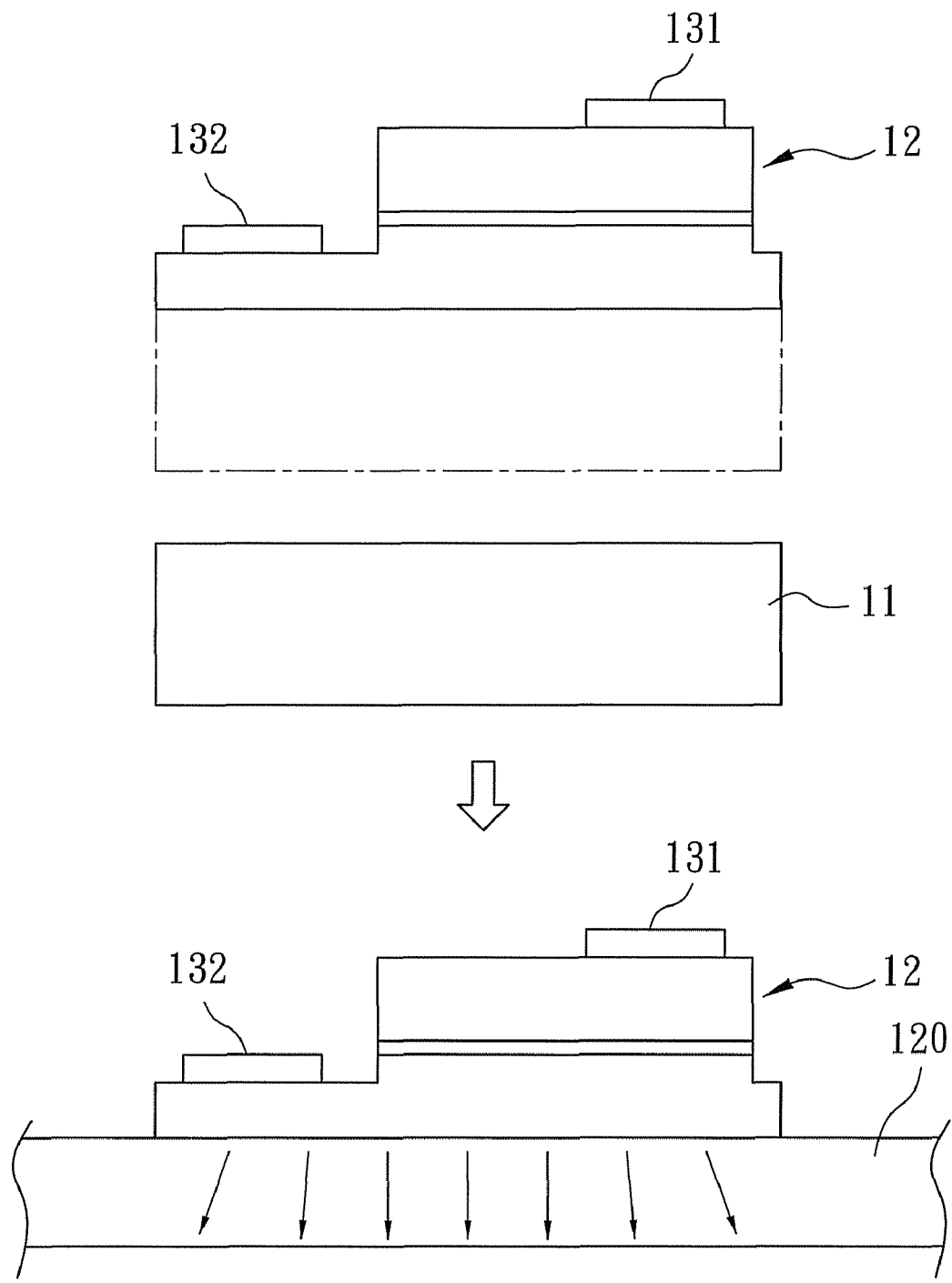
FIG. 2 is a fragmentary schematic view to illustrate how another conventional light-emitting diode is formed from the light-emitting diode of FIG. 1.

Before the present invention is described in greater detail with reference to the accompanying preferred embodiments, it should be noted herein that like elements are denoted by the same reference numerals throughout the disclosure.

Figure 3:
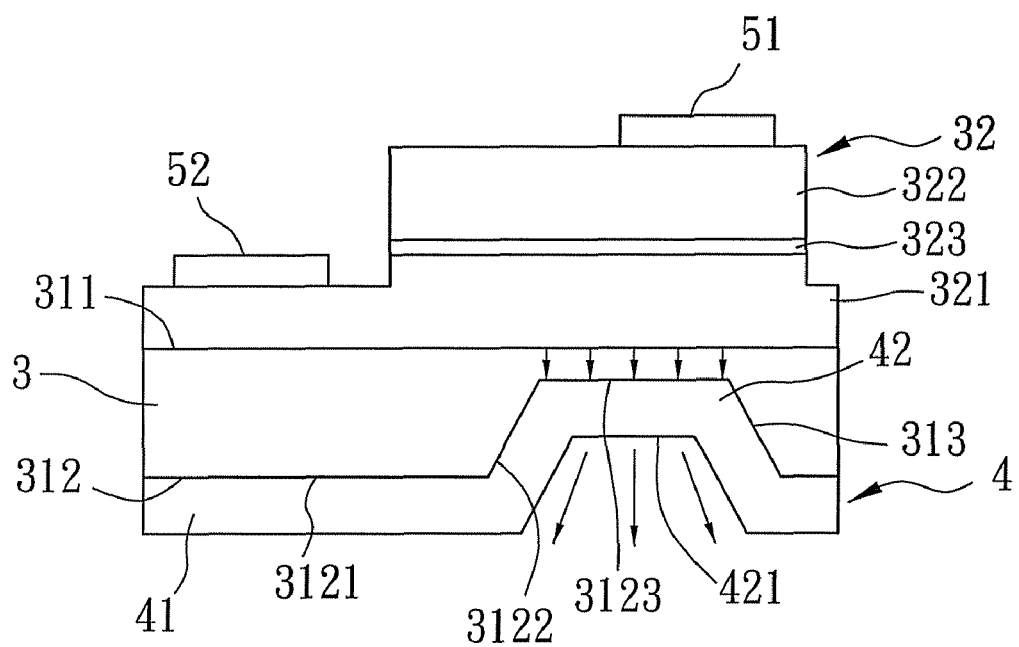
FIG. 3 is a schematic view of the first preferred embodiment of a light-emitting device according to this invention.

FIG. 3 illustrates the first preferred embodiment of a light-emitting device according to this invention.

The light-emitting device includes: a sapphire substrate 3 that has an epitaxial-forming surface 311 and a back surface 312 opposite to the epitaxial-forming surface 311, the sapphire substrate 3 being formed with a recess 313 indented from the back surface 312, the back surface 312 having a recessed portion 3122 that defines the recess 313, and a planar portion 3121 extending outwardly from the recessed portion 3122; an epitaxy layer 32 formed on the epitaxial-forming surface 311 of the sapphire substrate 3; a continuous heat-dissipating layer 4 formed on the planar portion 3121 and the recessed portion 3122 of the back surface 312 of the sapphire substrate 3; and first and second electrodes 51, 52 coupled electrically to the epitaxy layer 32.

Preferably, the recessed portion 3122 of the back surface 312 of the sapphire substrate 3 is formed through etching, laser drilling, waterjet drilling or mechanical drilling.

In this embodiment, the continuous heat-dissipating layer 4 has a planar section 41 formed on the planar portion 3121 of the back surface 312 of the sapphire substrate 3, and a bent section 42 extending from the planar section 41, and formed on and conforming to the recessed portion 3122 of the back surface 312 of the sapphire substrate 3 to define a groove 421 therein.

Preferably, the continuous heat-dissipating layer 4 is made from a material selected from the group consisting of Cu, Al, Au, Ag, Mo, Ni, AlN, WC, SiC, and combinations thereof.

Preferably, the recessed portion 3122 of the back surface 312 of the sapphire substrate 3 has an inner end 3123 that is spaced apart from the epitaxial-forming surface 311 of the sapphire substrate 3 by a distance not less than 5 μm so as to prevent formation of crystal defects in the epitaxy layer 32 during formation of the epitaxial layer 32 on the sapphire substrate 3.

It is noted that formation of the continuous heat-dissipating layer 4 is conducted by depositing a seed layer of a metal or an alloy on the back surface 312 of the sapphire substrate 3, and then electroplating the metal on the seed layer to increase its thickness. Optionally, the continuous heat-dissipating layer 4 can be prepared separate from the sapphire substrate 3, and then attached to the sapphire substrate 3.

Preferably, a buffer layer and a conductive layer (not shown) can be formed on the sapphire substrate 3 so as to reduce defects of the epitaxy layer 32 and to enhance light extraction efficiency. Optionally, a reflective mirror can be formed on the epitaxy layer 32 so as to increase device illumination.

Figure 4:
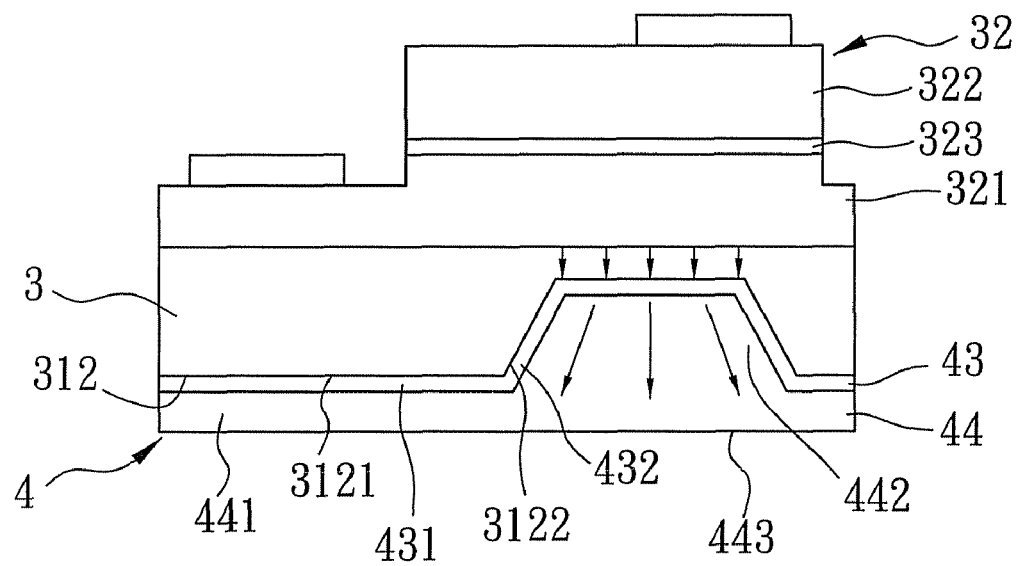
FIG. 4 is a schematic view of the second preferred embodiment of the light-emitting device according to this invention.

FIG. 4 illustrates the second preferred embodiment of the light-emitting device according to this invention. In the second preferred embodiment, the continuous heat-dissipating layer 4 includes a bonding sub-layer 43 having a planar section 431 formed on the planar portion 3121 of the back surface 312 of the sapphire substrate 3, and a recessed section 432 extending from the planar section 431 and formed on the recessed portion 3122 of the back surface 312 of the sapphire substrate 3, and a heat conductive sub-layer 44 formed on the bonding sub-layer 43 (see FIG. 4).

In this embodiment, the heat conductive sub-layer 44 has a planar segment 441 formed on the planar section 431 of the bonding sub-layer 43, and a protrusion 442 extending from the planar segment 441, and protruding into and contacting with the recessed section 432 of the bonding sub-layer 43. The heat conductive sub-layer 44 has a planar rear surface 443 opposite to the protrusion 442.

Preferably, the bonding sub-layer 43 is made from a material having a thermal expansion coefficient lower than those of the sapphire substrate 3 and the heat conductive sub-layer 44.

Preferably, the bonding sub-layer 43 is made from a material selected from the group consisting of $SiN_x$, $SiO_x$, SiC, and combinations thereof.

In the previous embodiments, the epitaxy layer 32 includes a p-cladding layer 322, an active layer 323, and an n-cladding layer 321.

In the previous embodiments, the first and second electrodes 51, 52 are formed on the p-cladding layer 322 and the n-cladding layer 321, respectively.

Figure 5:
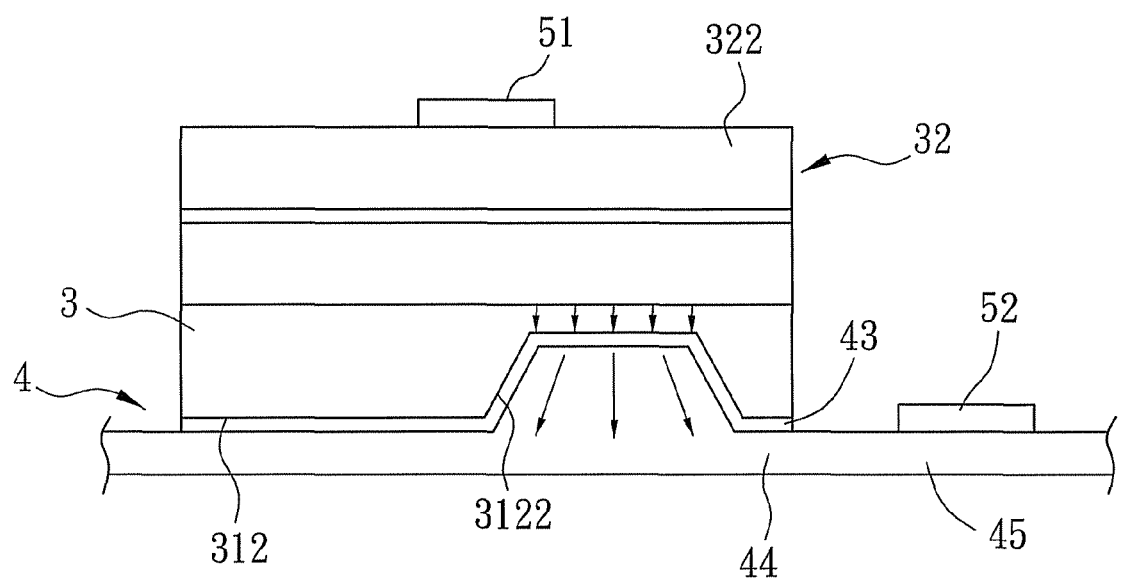
FIG. 5 is a fragmentary schematic view of the third preferred embodiment of the light-emitting device according to this invention.

FIG. 5 illustrates the third preferred embodiment of the light-emitting device according to this invention. In this embodiment, the light emitting device is a vertical-type light emitting diode, the heat conductive sub-layer 44 has an extension 45 disposed outwardly of the back surface 312 of the sapphire substrate 3, and the first and second electrodes 51, 52 are formed on the p-cladding layer 322 and the extension 45 of the heat conductive sub-layer 44, respectively.

In this embodiment, the recessed portion 3122 of the back surface 312 of the sapphire substrate 3 occupies about 30% of the total area of the back surface 312.

In operation, heat generated in the light-emitting device is mainly dissipated through the recessed portion 3122 of the back surface 312 of the sapphire substrate 3 and into the continuous heat-dissipating layer 4 and then into the ambient air, which is a shorter conductive path as compared to that of the conventional device shown in FIG. 1, thereby lowering the junction temperature of the light-emitting device and enhancing light extraction efficiency of the device.

By forming the recess 313 in the sapphire substrate 3 and the continuous heat-dissipating layer 4 of the light-emitting device of this invention, the aforesaid drawbacks associated with prior art can be eliminated.

With the invention thus explained, it is apparent that various modifications and variations can be made without departing from the spirit of the present invention. It is therefore intended that the invention be limited only as recited in the appended claims.

What is claimed is:

1. A light-emitting device comprising:
a substrate having an epitaxial-forming surface and a back surface opposite to said epitaxial-forming surface, said substrate being formed with a recess indented from said back surface, said back surface having a recessed portion that defines said recess, and a planar portion extending outwardly from said recessed portion, wherein said recessed portion of said back surface of said substrate has an inner end that is spaced apart from said epitaxial-forming surface of said substrate by a distance not less than 5 µm;
an epitaxy layer formed on said epitaxial-forming surface of said substrate;
a continuous heat-dissipating layer formed on said planar portion and said recessed portion of said back surface of said substrate, wherein the heat-dissipating layer has an extension disposed outwardly of the back surface of the substrate; and
first and second electrodes coupled electrically to said epitaxy layer,
wherein one of said first and second electrodes is formed on said epitaxy layer and the other of said first and second electrodes is formed on said extension of the heat dissipating layer.

2. The light-emitting device of claim 1, wherein said continuous heat-dissipating layer includes a bonding sub-layer formed on said planar portion and said recessed portion of said back surface of said substrate, and a heat conductive sub-layer formed on said bonding sub-layer.

3. The light-emitting device of claim 2, wherein said bonding sub-layer has a planar section formed on said planar portion of said back surface of said substrate, and a recessed section extending from said planar section and formed on said recessed portion of said back surface, said heat conductive sub-layer having a protrusion protruding into and contacting with said recessed section of said bonding sub-layer.

4. The light-emitting device of claim 2, wherein said bonding sub-layer is made from a material having a thermal expansion coefficient lower than those of said substrate and said heat conductive sub-layer.

5. The light-emitting device of claim 4, wherein said bonding sub-layer is made from a material selected from the group consisting of $SiN_x$, $SiO_x$, SiC, and combinations thereof.

6. The light-emitting device of claim 2, wherein one of said first and second electrodes is formed on said heat conductive sub-layer.

* * * * *